United States Patent
Widjaja

(10) Patent No.: US 7,760,548 B2
(45) Date of Patent: Jul. 20, 2010

(54) SEMICONDUCTOR MEMORY HAVING BOTH VOLATILE AND NON-VOLATILE FUNCTIONALITY AND METHOD OF OPERATING

(76) Inventor: Yuniarto Widjaja, 1657 Curtner Ave., San Jose, CA (US) 95125

( * ) Notice: Subject to any disclaimer, the term of this patent is extended or adjusted under 35 U.S.C. 154(b) by 404 days.

(21) Appl. No.: 11/998,311

(22) Filed: Nov. 29, 2007

(65) Prior Publication Data
US 2008/0123418 A1 May 29, 2008

Related U.S. Application Data

(60) Provisional application No. 60/861,778, filed on Nov. 29, 2006.

(51) Int. Cl.
*G11C 14/00* (2006.01)
(52) U.S. Cl. .............................. 365/185.08; 365/185.05
(58) Field of Classification Search ............ 365/185.08, 365/185.05
See application file for complete search history.

(56) References Cited

U.S. PATENT DOCUMENTS

| | | | |
|---|---|---|---|
| 4,959,812 A | 9/1990 | Momodomi et al. | |
| 5,519,831 A | 5/1996 | Holzhammer | |
| 6,163,048 A | 12/2000 | Hirose et al. | |
| 6,166,407 A * | 12/2000 | Ohta | 257/298 |
| 6,376,876 B1 | 4/2002 | Shin et al. | |
| 6,954,377 B2 * | 10/2005 | Choi et al. | 365/185.08 |
| 7,085,156 B2 | 8/2006 | Rerrant et al. | |
| 7,118,986 B2 | 10/2006 | Steigerwalt et al. | |
| 2005/0024968 A1 | 2/2005 | Lee et al. | |
| 2006/0125010 A1 | 6/2006 | Bhattacharyya | |
| 2008/0123418 A1 | 5/2008 | Widjaja | |
| 2009/0108351 A1 * | 4/2009 | Yang et al. | 257/347 |
| 2009/0109750 A1 * | 4/2009 | Widjaja | 365/185.03 |
| 2010/0008139 A1 * | 1/2010 | Bae | 365/185.03 |

OTHER PUBLICATIONS

Han et al. Programming/Erasing Characteristics of 45 nm NOR-Type Flash Memory Based on SOI FinFET Structure. vol. 47, Nov. 2005, pp. S564-S567.
Headland. Hot electron injection, 19th Feb. 2004.
Okhonin et al. A SOI Capacitor-less 1T-DRAM Concept. 2001, pp. 153-154.
Ranica et al. Scaled 1T-Bulk devices built with CMOS 90nm technology for low-cost eDRAM applications. Pascale.mazoyer@st.com, 2004, pp. 128-129.

* cited by examiner

*Primary Examiner*—Tuan T. Nguyen
(74) *Attorney, Agent, or Firm*—Law Office of Alan W. Cannon

(57) ABSTRACT

Semiconductor memory having both volatile and non-volatile modes and methods of operation. A semiconductor memory cell includes a substrate having a first conductivity type; a first region embedded in the substrate at a first location of the substrate and having a second conductivity type; a second region embedded in the substrate at a second location the substrate and have the second conductivity type, such that at least a portion of the substrate having the first conductivity type is located between the first and second locations and functions as a floating body to store data in volatile memory; a floating gate or trapping layer positioned in between the first and second locations and above a surface of the substrate and insulated from the surface by an insulating layer; the floating gate or trapping layer being configured to receive transfer of data stored by the volatile memory and store the data as nonvolatile memory in the floating gate or trapping layer upon interruption of power to the memory cell; and a control gate positioned above the floating gate or trapping layer and a second insulating layer between the floating gate or trapping layer and the control gate.

33 Claims, 10 Drawing Sheets

SEMICONDUCTOR MEMORY HAVING BOTH VOLATILE AND NON-VOLATILE FUNCTIONALITY AND METHOD OF OPERATING

CROSS-REFERENCE

This application claims the benefit of U.S. Provisional Application No. 60/861,778, filed Nov. 29, 2006, which application is incorporated herein, in its entirety, by reference thereto.

FIELD OF THE INVENTION

The present inventions relates to semiconductor memory technology. More specifically, the present invention relates to semiconductor memory having both volatile and non-volatile semiconductor memory features.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) device, retain stored data even in the absence of power supplied thereto. Unfortunately, non-volatile memory devices typically operate more slowly than volatile memory devices. Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices.

SUMMARY OF THE INVENTION

The present invention provides semiconductor memory having both volatile and non-volatile modes and methods of operation of the same.

In at least one embodiment, a semiconductor memory cell is provided including: a substrate having a first conductivity type; a first region embedded in the substrate at a first location of the substrate and having a second conductivity type; a second region embedded in the substrate at a second location the substrate and have the second conductivity type, such that at least a portion of the substrate having the first conductivity type is located between the first and second locations and functions as a floating body to store data in volatile memory; a floating gate or trapping layer positioned in between the first and second locations and above a surface of the substrate and insulated from the surface by an insulating layer; the floating gate or trapping layer being configured to receive transfer of data stored by the volatile memory and store the data as nonvolatile memory in the floating gate or trapping layer upon interruption of power to the memory cell; and a control gate positioned above the floating gate or trapping layer and a second insulating layer between the floating gate or trapping layer and the control gate.

In at least one embodiment, the surface comprises a top surface, the cell further comprising a buried layer at a bottom portion of the substrate, the buried layer having the second conductivity type.

In at least one embodiment, the first conductivity type is "p" type and the second conductivity type is "n" type.

In at least one embodiment, insulating layers bound the side surfaces of the substrate.

In at least one embodiment, the floating body is configured so that data can be written thereto by hot hole injection.

In at least one embodiment, when power to the cell is interrupted, data transfer from the floating body to the floating gate or trapping layer occurs and the floating gate or trapping layer stores the data as non-volatile memory.

In at least one embodiment, the floating gate or trapping layer stores a charge in non-volatile memory that is complementary to a charge that was stored in the floating body at a time when the power is interrupted.

In at least one embodiment, when power is restored to the cell, data transfer from the floating gate or trapping layer to the floating body occurs and the cell functions as volatile memory.

In at least one embodiment, a state of the floating gate or trapping layer is set to a positive state after the data is transferred from the floating gate or trapping layer to the floating body.

In at least one embodiment, the semiconductor memory cell functions as a binary cell.

In at least one embodiment, the semiconductor memory cell functions as a multi-level cell.

A method of operating a memory cell having a floating body for storing, reading and writing data as volatile memory, and a floating gate or trapping layer for storing data as non-volatile memory is provided, including: storing data to the floating body while power is applied to the memory cell; transferring the data stored in the floating body to the floating gate or trapping layer when power to the cell is interrupted; and storing the data in the floating gate or trapping layer as non-volatile memory.

In at least one embodiment, the data stored in the floating body is stored as volatile memory.

In at least one embodiment, the method further includes: transferring the data stored in the floating gate or trapping layer to the floating body when power is restored to the cell; and storing the data in the floating body as volatile memory.

In at least one embodiment, the data transferred is stored in the floating gate or trapping layer with a charge that is complementary to a charge of the floating body when storing the data.

In at least one embodiment, the transferring is a non-algorithmic process.

In at least one embodiment, the transferring is a parallel, non-algorithmic process.

In at least one embodiment, the method further includes restoring the floating gate or trapping layer to a predetermined charge state.

In at least one embodiment, the method further includes writing a predetermined state to the floating body prior to the transferring the data stored in the floating gate or trapping layer to the floating body.

In at least one embodiment, the predetermined state is state "0".

A method of operating a semiconductor storage device comprising a plurality of memory cells each having a floating body for storing, reading and writing data as volatile memory, and a floating gate or trapping layer for storing data as non-volatile memory is provided, including: storing data to the floating bodies as volatile memory while power is applied to the device; transferring the data stored in the floating bodies, by a parallel, non-algorithmic process, to the floating gates or trapping layers corresponding to the floating bodies, when power to the device is interrupted; and storing the data in the floating gates or trapping layers as non-volatile memory.

In at least one embodiment, the method further includes: transferring the data stored in the floating gates or trapping layers, by a parallel, non-algorithmic restore process, to the floating bodies corresponding to the floating gates or trapping layers, when power is restored to the cell; and storing the data in the floating bodies as volatile memory.

In at least one embodiment, the method further includes initializing the floating gates or trapping layers, to each have the same predetermined state prior to the transferring.

In at least one embodiment, the predetermined state comprises a positive charge.

In at least one embodiment, the data transferred is stored in the floating gates or trapping layers with charges that are complementary to charges of the floating bodies when storing the data.

In at least one embodiment, the method further includes restoring the floating gates or trapping layers to a predetermined charge state after the restore process.

In at least one embodiment, the method further includes writing a predetermined state to the floating bodies prior to the transferring the data stored in the floating gates or trapping layers to the floating bodies.

A semiconductor storage device comprising a plurality of memory cells each having a floating body for storing, reading and writing data as volatile memory, and a floating gate or trapping layer for storing data as non-volatile memory is provided, the device operating as volatile memory when power is applied to the device, and the device storing data from the volatile memory as non-volatile memory when power to the device is interrupted.

In at least one embodiment, data is transferred from the volatile memory to the non-volatile memory by a parallel, non-algorithmic mechanism.

In at least one embodiment, the device is configured to transfer data stored in non-volatile memory to store the data in the volatile memory when power is restored to the device.

In at least one embodiment, the data is transferred from the non-volatile memory to the volatile memory by a parallel, non-algorithmic mechanism.

These and other features of the invention will become apparent to those persons skilled in the art upon reading the details of the devices and methods as more fully described below.

DETAILED DESCRIPTION OF THE INVENTION

Figure 1:
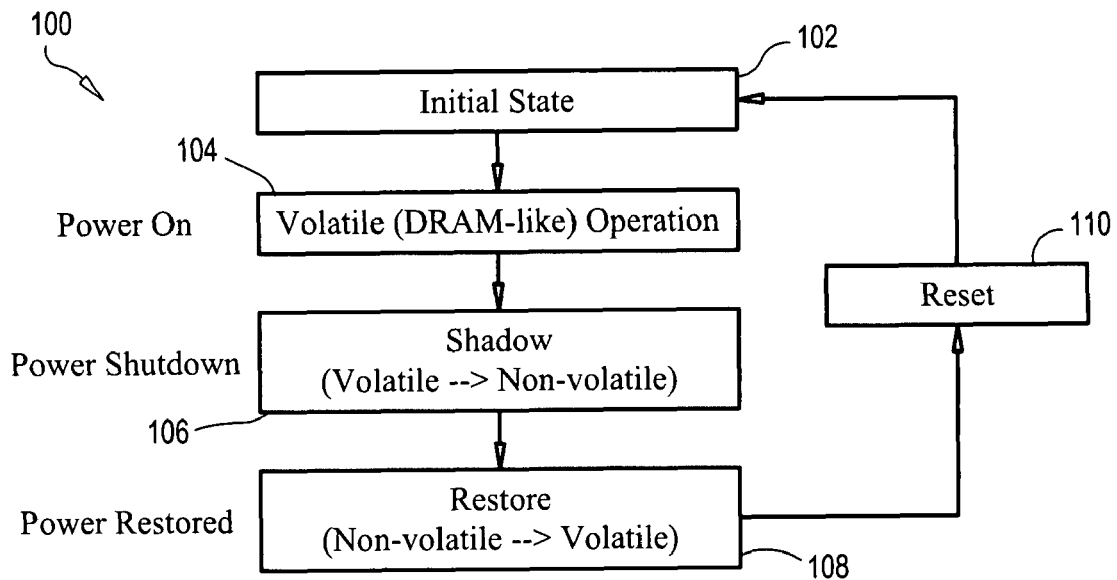
FIG. 1 is a flowchart illustrating operation of a memory device according to the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a device" includes a plurality of such devices and reference to "the transistor" includes reference to one or more transistors and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "shadowing" "shadowing operation" and "shadowing process" refer to a process of copying the content of volatile memory to non-volatile memory.

"Restore", "restore operation", or "restore process", as used herein, refers to a process of copying the content of non-volatile memory to volatile memory.

"Reset", "reset operation", or "reset process", as used herein, refers to a process of setting non-volatile memory to a predetermined state following a restore process, or when otherwise setting the non-volatile memory to an initial state (such as when powering up for the first time, prior to ever storing data in the non-volatile memory, for example).

FIG. 1 is a flowchart 100 illustrating operation of a memory device according to the present invention. At event 102, when power is first applied to the memory device, the memory device is placed in an initial state, in a volatile operational mode and the nonvolatile memory is set to a predetermined state, typically set to have a positive charge. At event 104 the memory device of the present invention operates in the same manner as a conventional DRAM memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period.

After the content of the volatile memory has been moved during a shadowing operation to nonvolatile memory, the shutdown of the memory device occurs, as power is no longer supplied to the volatile memory. At this time, the memory device functions like a Flash EPROM device in that it retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device is again set to the initial state (event 102) and again operates in a volatile mode, like a DRAM memory device, event 104.

The present invention thus provides a memory device which combines the fast operation of volatile memories with the ability to retain charge that is provided in nonvolatile memories. Further, the data transfer from the volatile mode to the non-volatile mode and vice versa, operate in parallel by a non-algorithmic process described below, which greatly enhances the speed of operation of the storage device. As one non-limiting practical application of use of a memory device according to the present invention, a description of operation of the memory device in a personal computer follows. This example is in no way intended to limit the applications in which the present invention may be used, as there are many applications, including, but not limited to: cell phones, laptop computers, desktop computers, kitchen appliances, land line phones, electronic gaming, video games, personal organizers, mp3 and other electronic forms of digital music players, and any other applications, too numerous to mention here, that use digital memory. In use, the volatile mode provides a fast access speed and is what is used during normal operations (i.e., when the power is on to the memory device). In an example of use in a personal computer (PC), when the power to the PC is on (i.e., the PC is turned on), the memory device according to the present invention operates in volatile mode. When the PC is shut down (i.e., power is turned off), the memory content of the volatile memory is shadowed to the non-volatile memory of the memory device according to the present invention. When the PC is turned on again (power is turned on), the memory content is restored from the non-volatile memory to the volatile memory. A reset process is then conducted on the non-volatile memory so that its data does not interfere with the data having been transferred to the volatile memory.

Figure 2:
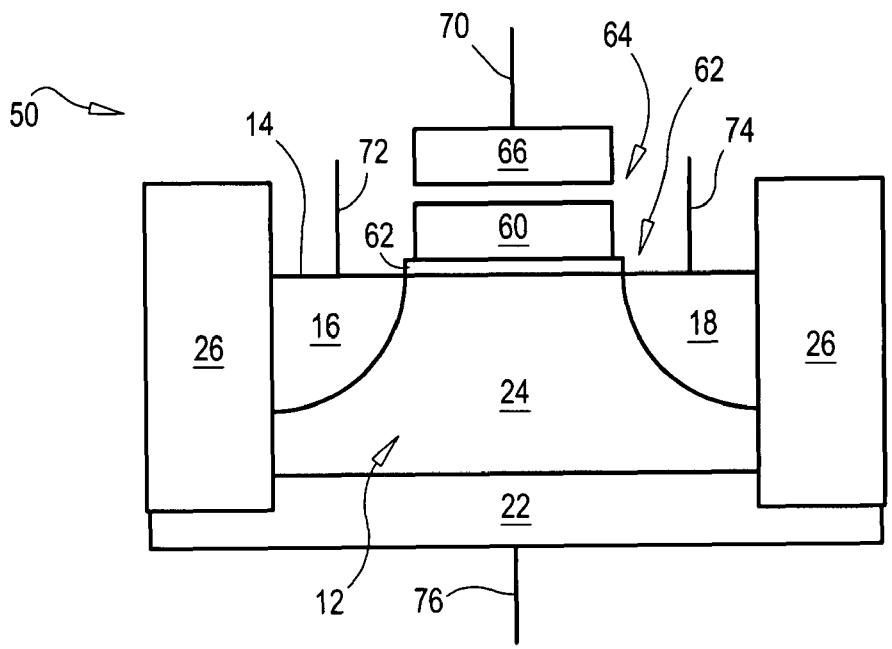
FIG. 2 schematically illustrates an embodiment of a memory cell according to the present invention.

FIG. 2 schematically illustrates an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI)), which may be made of silicon oxide, for example. Insulating layers 26 insulate cell 50 from neighboring cells 50 when multiple cells 50 are joined to make a memory device. A floating gate or trapping layer 60 is positioned in between the regions 16 and 18, and above the surface 14. Trapping layer/floating gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. Floating gate/trapping layer 60 may be made of polysilicon material. If a trapping layer is chosen, the trapping layer may be made from silicon nitride or silicon nanocrystal, etc. Whether a floating gate 60 or a trapping layer 60 is used, the function is the same, in that they hold data in the absence of power. The primary difference between the floating gate 60 and the trapping layer 60 is that the floating gate 60 is a conductor, while the trapping layer 60 is an insulator layer. Thus, typically one or the other of trapping layer 60 and floating gate 60 are employed in device 50, but not both.

A control gate 66 is positioned above floating gate/trapping layer 60 and insulated therefrom by insulating layer 64 such that floating gate/trapping layer 60 is positioned between insulating layer 62 and surface 14 underlying floating gate/trapping layer 60, and insulating layer 64 and control gate 66 positioned above floating gate/trapping layer 60, as shown. Control gate 66 is capacitively coupled to floating gate/trapping layer 60. Control gate 66 is typically made of polysilicon material or metal gate electrode, such as tungsten, tantalum, titanium and their nitrides. The relationship between the floating gate/trapping layer 60 and control gate 66 is similar to that of a nonvolatile stacked gate floating gate/trapping layer memory cell. The floating gate/trapping layer 60 functions to store non-volatile memory data and the control gate 66 is used for memory cell selection.

Cell 50 includes four terminals: word line (WL) terminal 70, source line (SL) terminal 72, bit line (BL) terminal 74 and buried well (BW) terminal 76. Terminal 70 is connected to control gate 66. Terminal 72 is connected to first region 16 and terminal 74 is connected to second region 18. Alternatively, terminal 72 can be connected to second region 18 and terminal 74 can be connected to first region 16. Terminal 76 is connected to buried layer 22.

When power is applied to cell 50, cell 50 operates like a currently available capacitorless DRAM cell. In a capacitorless DRAM device, the memory information (i.e., data that is stored in memory) is stored as charge in the floating body of the transistor, i.e., in the body 24 of cell 50. The presence of the electrical charge in the floating body 24 modulates the threshold voltage of the cell 50, which determines the state of the cell 50.

Figure 3A:
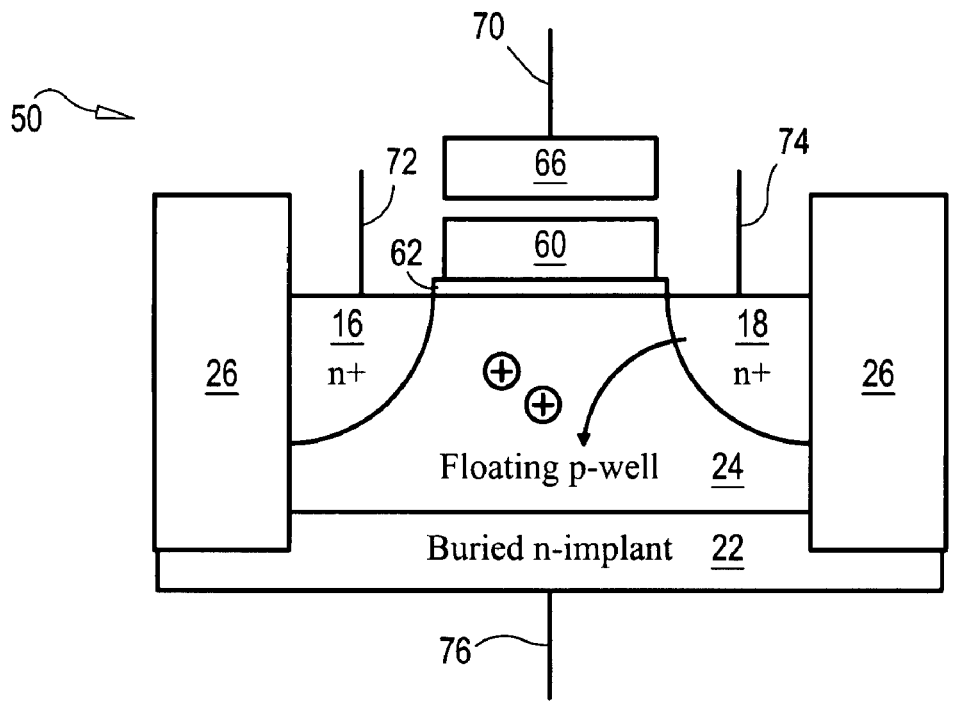
FIGS. 3A-3B illustrate alternative write state "1" operations that can be carried out on a memory cell according to the present invention.
Figure 3B:
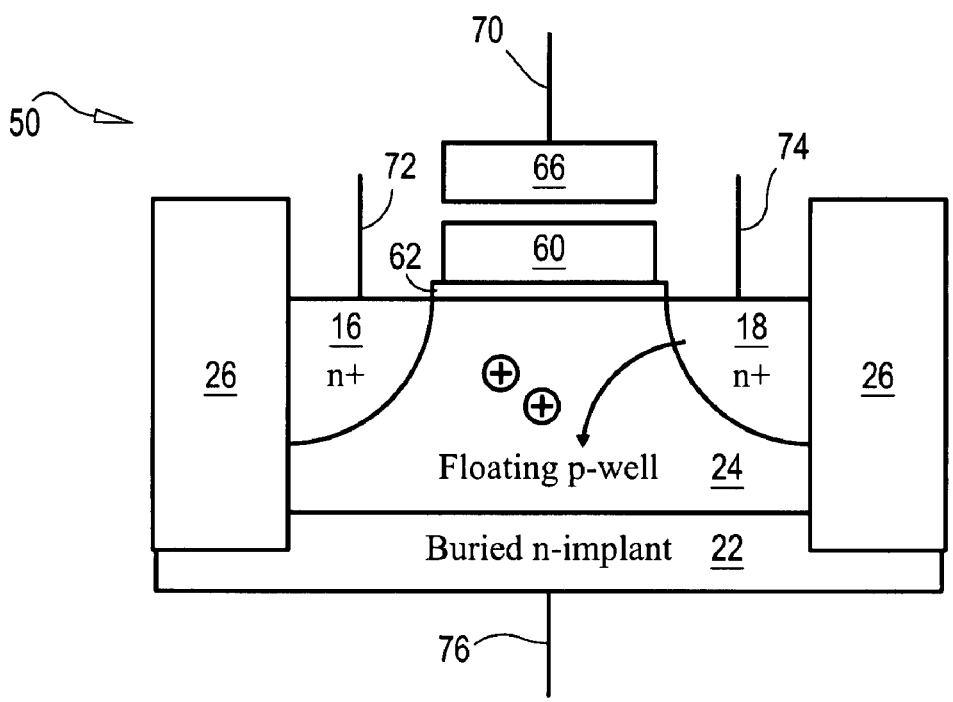

FIGS. 3A-3B illustrate alternative write state "1" operations that can be carried out on cell 50, by performing band-to-band tunneling hot hole injection (FIG. 3A) or impact ionization hot hole injection (FIG. 3B). In alternative embodiments, electrons can be transferred, rather than holes. In FIG. 3A, to write a state "1" into the floating body region 24, a substantially neutral voltage is applied to SL terminal 72, a positive voltage is applied to BL terminal 74, a negative voltage is applied to WL terminal 70 and a positive voltage less than the positive voltage applied to the BL terminal 74 is applied to BW terminal 76. Under these conditions, holes are injected from BL terminal 76 into the floating body region 24, leaving the body region 24 positively charged. In one particular non-limiting embodiment, a charge of about 0.0 volts is applied to terminal 72, a charge of about +2.0 volts is applied to terminal 74, a charge of about −1.2 volts is applied to terminal 70, and a charge of about +0.6 volts is applied to terminal 76. However, these voltage levels may vary, while maintaining the relative relationships between the charges applied, as described above. For example, voltage applied to terminal 72 may be in the range of about 0.0 volts to about +0.4 volts, voltage applied to terminal 74 may be in the range of about +1.5 volts to about +3.0 volts, voltage applied to terminal 70 may be in the range of about 0.0 volts to about −3.0 volts, and voltage applied to terminal 76 may be in the range of about 0.0 volts to about +1.0 volts. Further, the voltages applied to terminals 72 and 74 may be reversed, and still obtain the same result, e.g., a positive voltage applied to terminal 72 and a neutral charge applied to terminal 74.

Alternatively, as illustrated in FIG. 3B, to write a state "1" into the floating body region 24, a substantially neutral voltage is applied to SL terminal 72, a positive voltage is applied to BL terminal 74, a positive voltage less positive than the positive voltage applied to terminal 72 is applied to WL terminal 70 and a positive voltage less positive than the positive voltage applied to terminal 74 is applied to BW terminal 76. Under these conditions, holes are injected from BL terminal 74 into the floating body region 24, leaving the body region 24 positively charged. In one particular non-limiting embodiment, about 0.0 volts is applied to terminal 72, about +2.0 volts is applied to terminal 74, about +1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about 0.0 volts to about +0.6 volts, voltage applied to terminal 74 may be in the range of about +1.5 volts to about +3.0 volts, voltage applied to terminal 70 may be in the range of about 0.0 volts to about +1.6 volts, and voltage applied to terminal 76 may be in the range of about 0.0 volts to about 1.0 volts. Further, the voltages applied to terminals 72 and 74 may be reversed, and still obtain the same result, e.g., a positive voltage applied to terminal 72 and a neutral charge applied to terminal 74.

Figure 4:
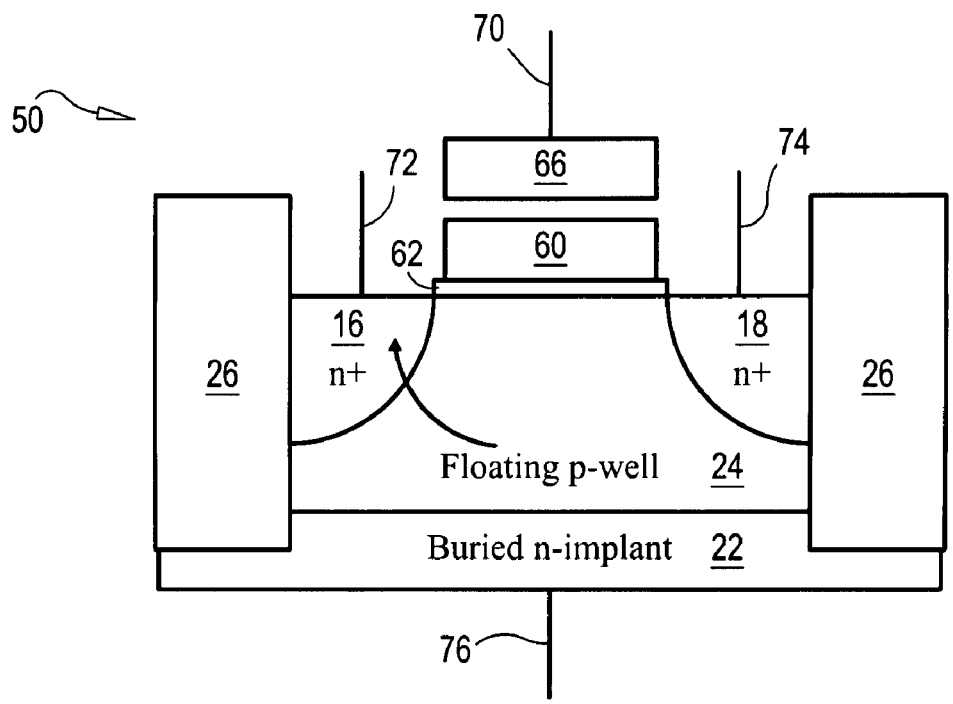
FIG. 4 illustrates a write state "0" operation that can be carried out on a memory cell according to the present invention.

FIG. 4 illustrates a write state "0" operation that can be carried out on cell 50. To write a state "0" into floating body region 24, a negative voltage is applied to SL terminal 72, a substantially neutral voltage is applied to BL terminal 74, a negative voltage less negative than the negative voltage applied to terminal 72 is applied to WL terminal 70 and a positive voltage is applied to BW terminal 76. Under these conditions, the p-n junction (junction between 24 and 16 and between 24 and 18) is forward-biased, evacuating any holes from the floating body 24. In one particular non-limiting embodiment, about −2.0 volts is applied to terminal 72, about 0.0 volts is applied to terminal 74, about −1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about −1.0 volts to about −3.0 volts, voltage applied to terminal 74 may be in the range of about 0.0 volts to about −3.0 volts, voltage applied to terminal 70 may be in the range of about 0.0 volts to about −3.0 volts, and voltage applied to terminal 76 may be in the range of about 0.0 volts to about 1.0 volts. Further, the voltages applied to terminals 72 and 74 may be reversed, and still obtain the same result, e.g., a substantially neutral voltage applied to terminal 72 and a negative charge applied to terminal 74.

Figure 5:
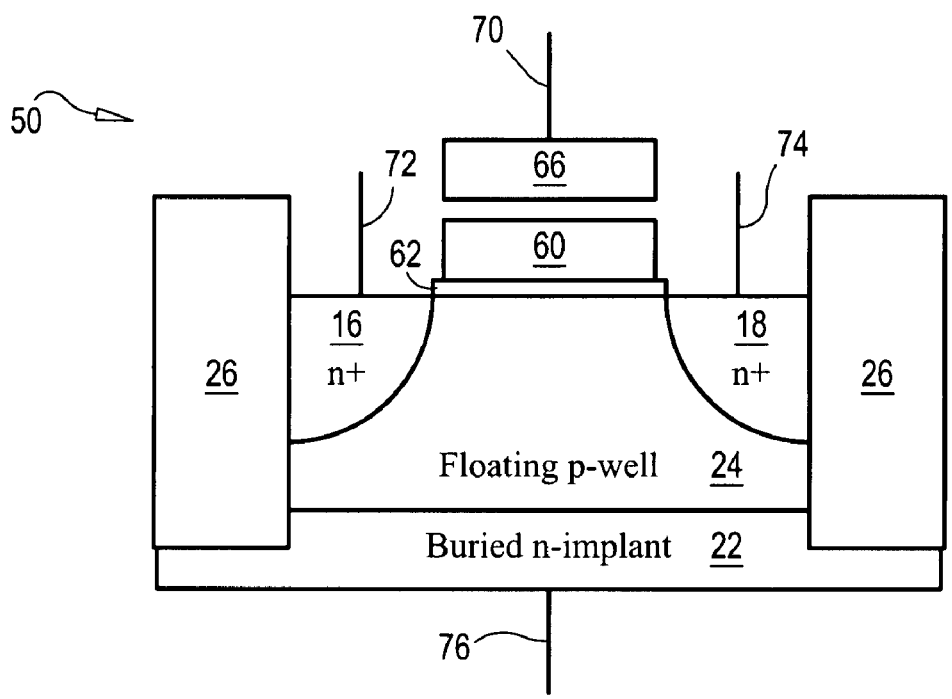
FIG. 5 illustrates a read operation that can be carried out on a memory cell according to the present invention.

A read operation of the cell 50 is now described with reference to FIG. 5. To read cell 50, a substantially neutral charge volts is applied to SL terminal 72, a positive voltage is applied to BL terminal 74, a positive voltage that is more positive than the positive voltage applied to terminal 74 is applied to WL terminal 70 and a positive voltage that is less than the positive voltage applied to terminal 70 is applied to BW terminal 76. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, and about +0.6 volts is applied to terminal 76. However, these voltage levels may vary, while maintaining the relative relationships between the charges applied, as described above. For example, terminal 72 is grounded and is thus at about 0.0 volts, voltage applied to terminal 74 may be in the range of about +0.1 volts to about +1.0 volts, voltage applied to terminal 70 may be in the range of about +1.0 volts to about +3.0 volts, and voltage applied to terminal 76 may be in the range of about 0.0 volts to about 1.0 volts. Further, the voltages applied to terminals 72 and 74 may be reversed, and still obtain the same result, e.g., a positive voltage applied to terminal 72 and a neutral charge applied to terminal 74.

Figure 6A:
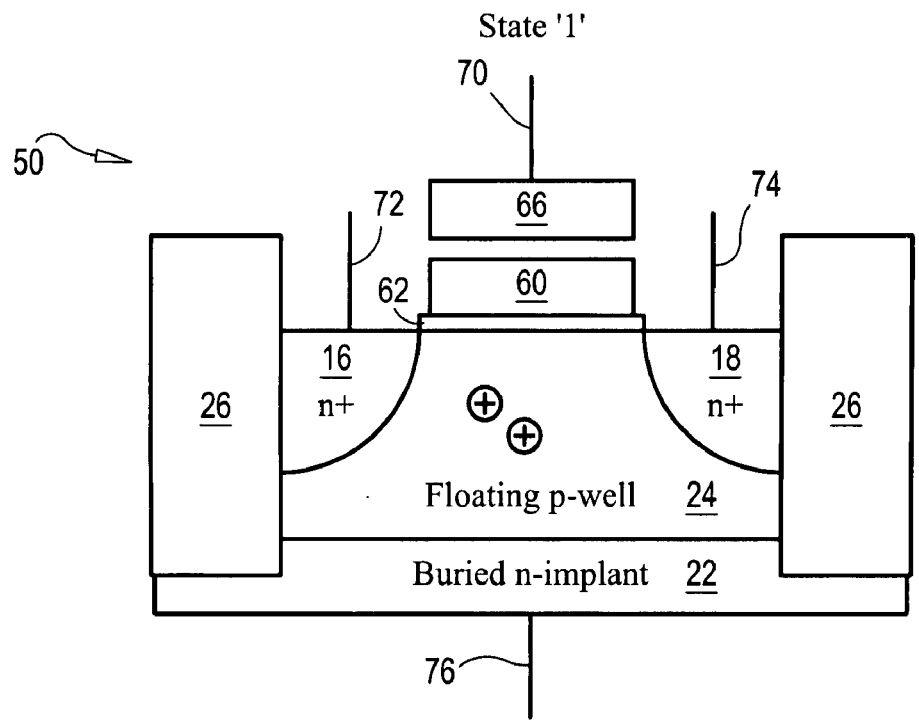
FIGS. 6A and 6B illustrate shadowing operations according to the present invention.
Figure 6B:
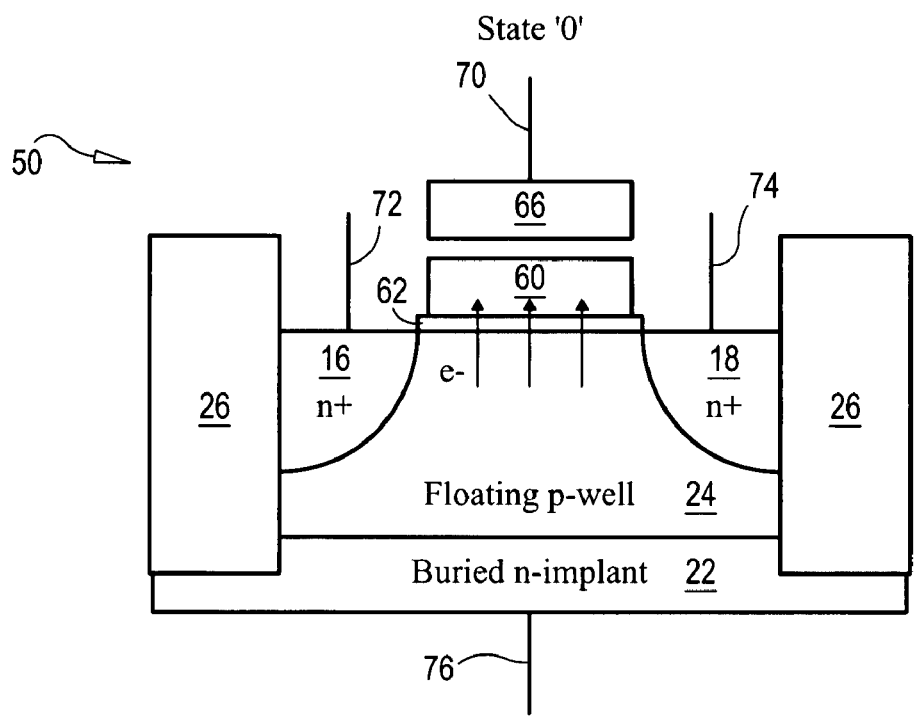

When power down is detected, e.g., when a user turns off the power to cell 50, or the power is inadvertently interrupted, or for any other reason, power is at least temporarily discontinued to cell 50, data stored in the floating body region 24 is transferred to floating gate/trapping layer 60. This operation is referred to as "shadowing" and is described with reference to FIGS. 6A and 6B. To perform the shadowing operation, both SL terminal 72 and BL terminal 74 are left floating (i.e., not held to any specific voltage, but allowed to float to their respective voltages). A high positive voltage (e.g., about +18 volts) is applied to WL terminal 70 and a low positive voltage (e.g., about +0.6 volts) is applied to BW terminal 76. If cell 50 is in a state "1" as illustrated in FIG. 6A, thus having holes in body region 24, a lower electric field between the floating gate/trapping layer 60 and the floating body region 24 is observed in comparison to the electric field observed between the floating gate/trapping layer 60 and the floating body region 24 when cell 50 is in a state "0" as illustrated in FIG. 6B.

The high electric field between the floating gate/trapping layer region 60 and the floating body region 24, when floating body 24 is at state "0" causes electrons to tunnel from floating body 24 to floating gate/trapping layer 60 and the floating gate/trapping layer 60 thus becomes negatively charged. Conversely, the relatively lower electric field existent between the floating gate/trapping layer region 60 and floating body 24 when cell 50 is in the state "1" is not sufficient to cause electron tunneling from the floating body 24 to floating gate/trapping layer 60 and therefore floating gate/trapping layer 60 does not become negatively charged in this situation.

In one particular non-limiting embodiment, terminals 72 and 74 are allowed to float, about +18 volts is applied to terminal 70, and about +0.6 volts is applied to terminal 76. However, these voltage levels may vary, while maintaining the relative relationships between the charges applied, as described above. For example, voltage applied to terminal 70 may be in the range of about +12.0 volts to about +20.0 volts, and voltage applied to terminal 76 may be in the range of about 0.0 volts to about 1.0 volts.

Figure 7A:
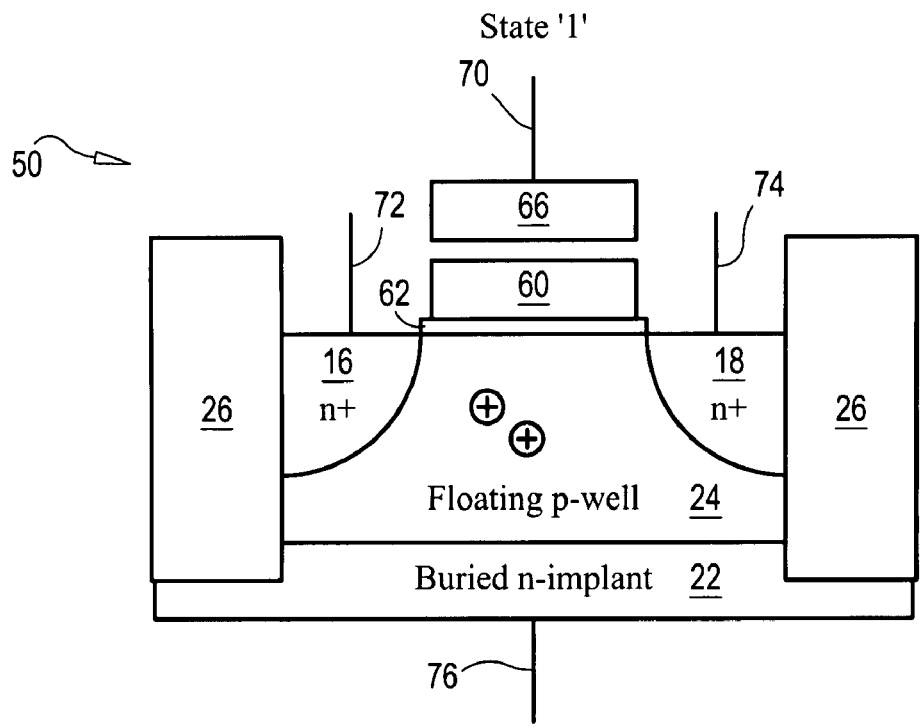
FIGS. 7A and 7B illustrate restore operations according to the present invention.
Figure 7B:
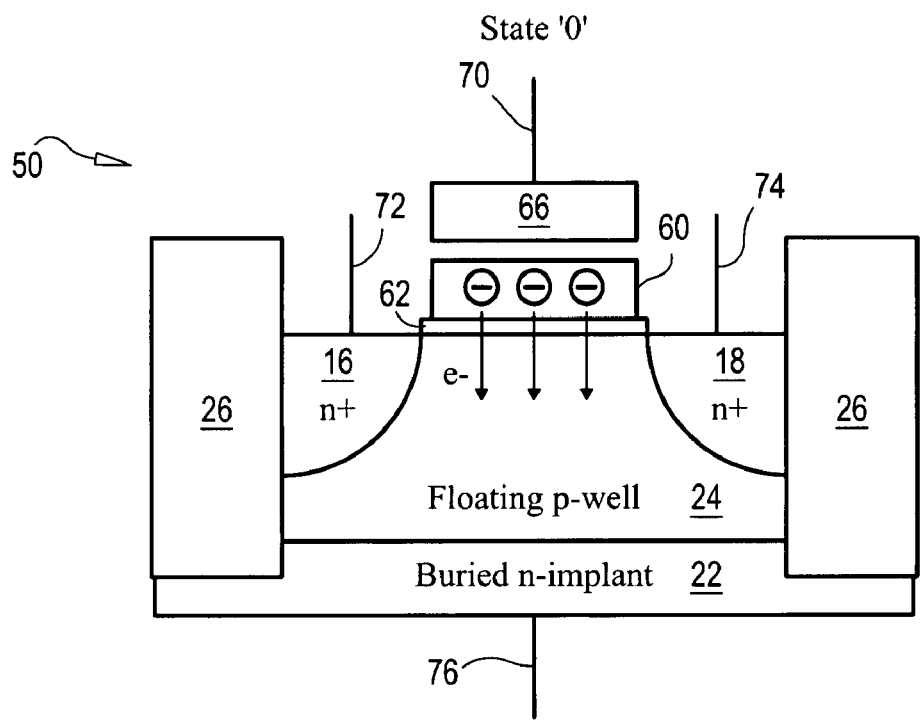

When power is restored to cell 50, the state of the cell 50 as stored on floating gate/trapping layer 60 is restored into floating body region 24. The restore operation (data restoration from non-volatile memory to volatile memory) is described with reference to FIGS. 7A and 7B. Prior to the restore operation/process, the floating body 24 is set to a positive charge, i.e., a "1" state is written to floating body 24. In one embodiment, to perform the restore operation, both SL terminal 72 and BL terminal 74 are left floating. A large negative voltage is applied to WL terminal 70 and a low positive voltage is applied to BW terminal 76. If the floating gate/trapping layer 60 is not negatively charged, no electrons will tunnel from floating gate/trapping layer 60 to floating body 24, and cell 50 will therefore be in a state "1". Conversely, if floating gate/trapping layer 60 is negatively charged, electrons tunnel from floating gate/trapping layer 60 into floating body 24, thereby placing cell 50 in a state "0". In one particular non-limiting embodiment, about −18.0 volts is applied to terminal 70, and about +0.6 volts is applied to terminal 76. However, these voltage levels may vary, while maintaining the relative relationships between the charges applied, as described above. For example, voltage applied to terminal 70 may be in the range of about −12.0 volts to about −20.0 volts, and voltage applied to terminal 76 may be in the range of about 0.0 volts to about +1.0 volts.

Note that this process occurs non-algorithmically, as the state of the floating gate/trapping layer 60 does not have to be read, interpreted, or otherwise measure to determine what state to restore the floating body 24 to. Rather, the restoration process occurs automatically, driven by electrical potential differences. Accordingly, this process is orders of magnitude faster than one that requires algorithmic intervention. Similarly, it is noted that the shadowing process also is performed as a non-algorithmic process. From these operations, it has been shown that cell 50 provides a memory cell having the advantages of a DRAM cell, but where non-volatility is also achieved.

FIGS. 8A-8D illustrate another embodiment of operation of cell 50 to perform a volatile to non-volatile shadowing process, which operates by a hot electron injection process, in contrast to the tunneling process (e.g., Fowler-Nordheim tunneling process) described above with regard to FIGS. 6A-6B. FIG. 8E illustrates the operation of an NPN bipolar device 90, as it relates to the operation of cell 50. Floating body 24 is represented by the terminal to which voltage $V_{FB}$ is applied in FIG. 8E, and the terminals 72 and 74 are represented by terminals to which voltages $V_{SL}$ and $V_{BL}$ are applied, respectively. When $V_{FB}$ is a positive voltage, this turns on the bipolar device 90, and when $V_{FB}$ is a negative or neutral voltage, the device 90 is turned off. Likewise, when floating body 24 has a positive voltage, this turns on the cell 50 so that current flows through the NPN junction formed by 16, 24 and 18 in the direction indicated by the arrow in floating body 24 in FIG. 8A, and when floating body 24 has a negative or neutral voltage, cell is turned off, so that there is no current flow through the NPN junction.

Figure 8A:
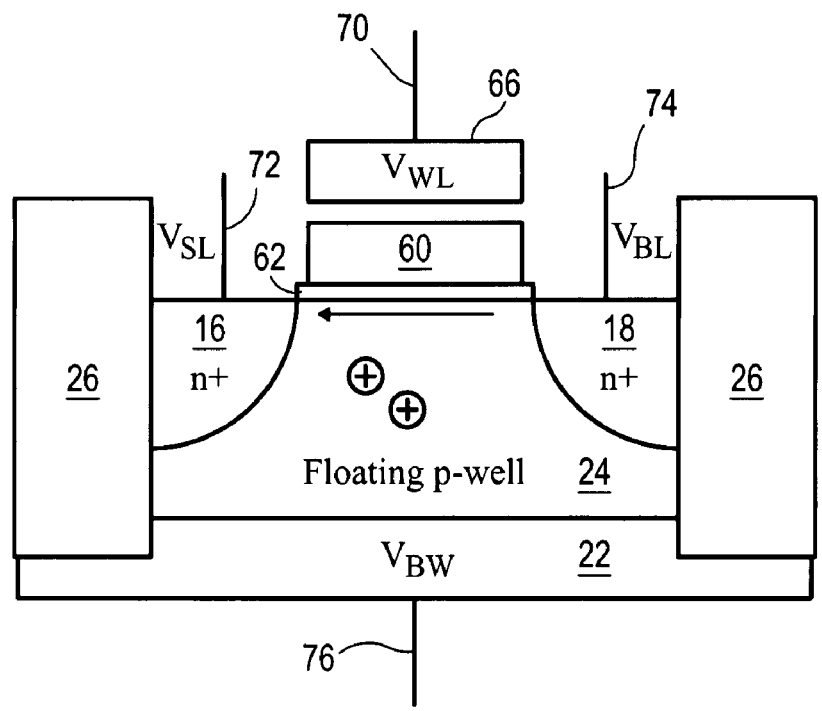
FIGS. 8A-8D illustrate another embodiment of operation of a memory cell to perform volatile to non-volatile shadowing according to the present invention.
Figure 8B:
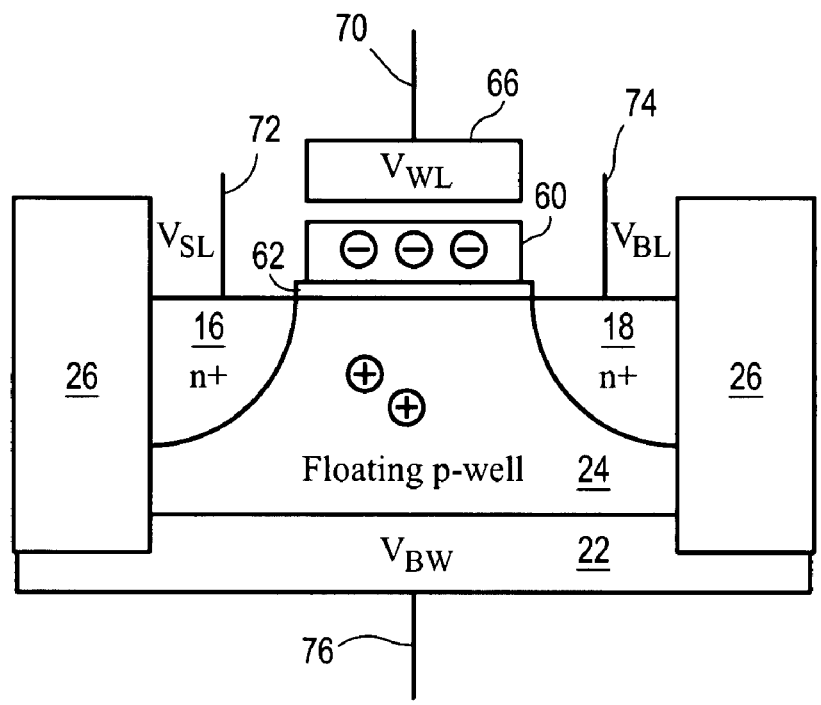

To perform a shadowing process according to the embodiment described with regard to FIGS. 8A-8D, a high positive voltage is applied to terminal 72 and a substantially neutral voltage is applied to terminal 74. Alternatively, a high positive voltage can be applied to terminal 74 and a substantially neutral voltage can be applied to terminal 72. A positive voltage is applied to terminal 70 and a low positive voltage is applied to terminal 76. A high voltage in this case is a voltage greater than or equal to about +3 volts. In one example, a voltage in the range of about +3 to about +6 volts is applied, although it is possible to apply a higher voltage. The floating gate/trapping layer 60 will have been previously initialized or reset to have a positive charge prior to the operation of the cell 50 to store data in non-volatile memory via floating body 24. When floating body 24 has a positive charge/voltage, the NPN junction is on, as noted above, and electrons flow in the direction of the arrow shown in the floating body 24 in FIG. 8A. The application of the high voltage to terminal 72 at 16 energizes/accelerates electrons traveling through the floating body 24 to a sufficient extent that they can "jump over" the oxide barrier between floating body 24 and floating gate/trapping layer 60, so that electrons enter floating gate/trapping layer 60 as indicated by the arrow into floating gate/trapping layer 60 in FIG. 8A. Accordingly, floating gate/trapping layer 60 becomes negatively charged by the shadowing process, when the volatile memory of cell 50 is in state "1" (i.e., floating body 24 is positively charged), as shown in FIG. 8B.

Figure 8C:
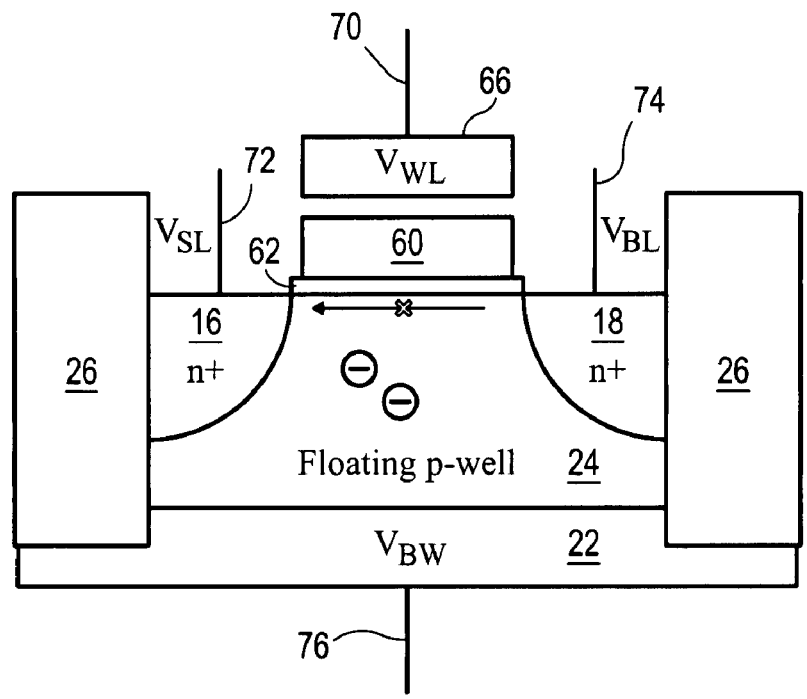
Figure 8D:
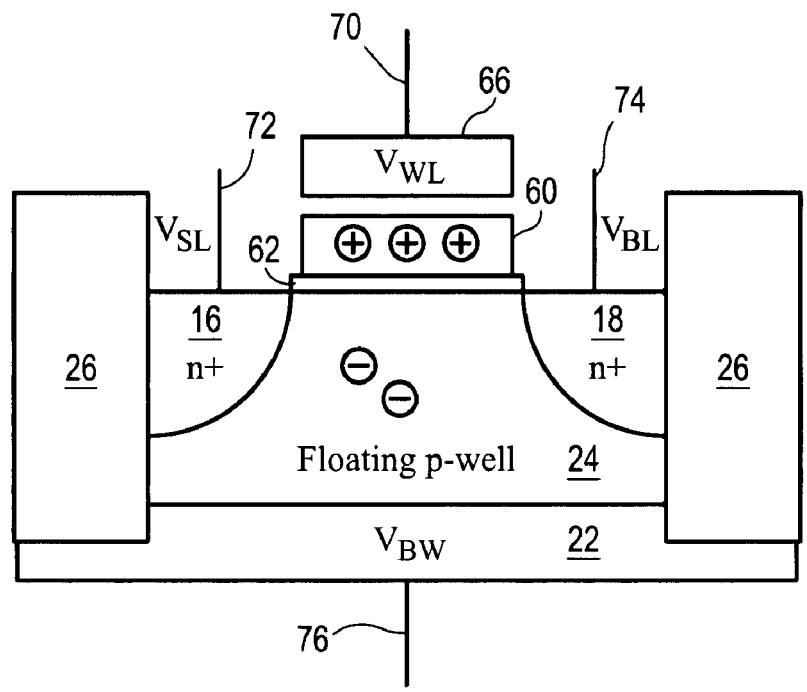
Figure 8E:
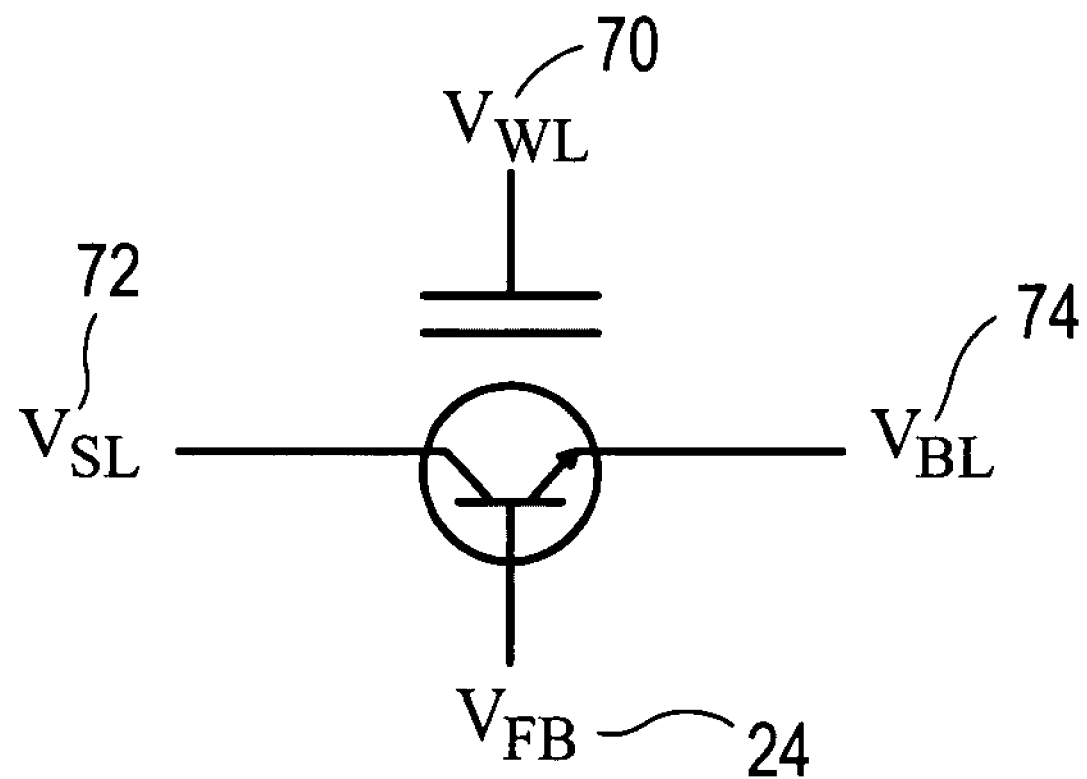
FIG. 8E illustrates the operation of an NPN bipolar device.

When volatile memory of cell 50 is in state "0", i.e., floating body 24 has a negative or neutral charge/voltage, the NPN junction is off, as noted above, and electrons do not flow in the floating body 24, as illustrated in FIG. 8C. Accordingly, when voltages are applied to the terminals as described above, in order to perform the shadowing process, the high positive voltage applied to terminal 72 does not cause an acceleration of electrons in order to cause hot electron injection into floating gate/trapping layer 60, since the electrons are not flowing. Accordingly, floating gate/trapping layer 60 retains its positive charge at the end of the shadowing process, when the volatile memory of cell 50 is in state "0" (i.e., floating body 24 is neutral or negatively charged), as shown in FIG. 8D. Note that the charge state of the floating gate/trapping layer 60 is complementary to the charge state of the floating body 24 after completion of the shadowing process. Thus, if the floating body 24 of the memory cell 50 has a positive charge in volatile memory, the floating gate/trapping layer 60 will become negatively charged by the shadowing process, whereas if the floating body of the memory cell 50 has a negative or neutral charge in volatile memory, the floating gate/trapping layer 60 will be positively charged at the end of the shadowing operation. The charges/states of the floating gates/trapping layers 60 are determined non-algorithmically by the states of the floating bodies, and shadowing of multiple cells occurs in parallel, therefore the shadowing process is very fast.

In one particular non-limiting example of the shadowing process according to this embodiment, about +3 volts are applied to terminal 72, about 0 volts are applied to terminal 74, about +1.2 volts are applied to terminal 70, and about +0.6 volts are applied to terminal 76. However, these voltage levels may vary, while maintaining the relative relationships between the charges applied, as described above. For example, voltage applied to terminal 72 may be in the range of about +3 volts to about +6 volts, the voltage applied to terminal 74 may be in the range of about 0.0 volts to about +0.4 volts, the voltage applied to terminal 70 may be in the range of about 0.0 volts to about +1.6 volts, and voltage applied to terminal 76 may be in the range of about 0.0 volts to about +1.0 volts.

Figure 9A:
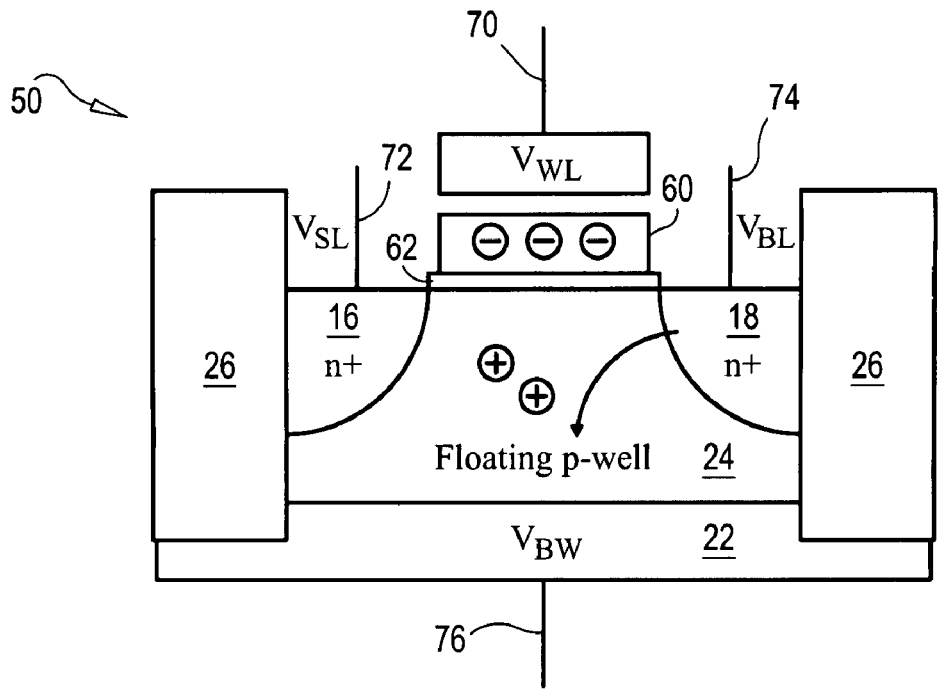
FIGS. 9A-9B illustrate another embodiment of operation of a memory cell to perform a restore process from non-volatile to volatile memory according to the present invention.
Figure 9B:
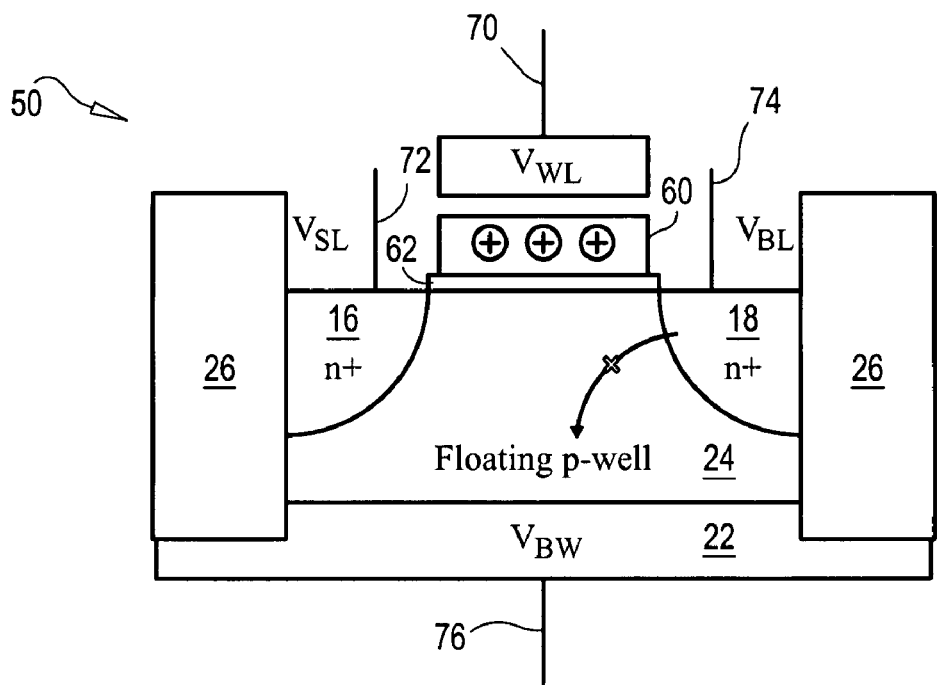

Turning now to FIGS. 9A-9B, another embodiment of operation of cell 50 to perform a restore process from non-volatile to volatile memory is schematically illustrated, in which the restore process operates by a band-to-band tunneling hot hole injection process (modulated by the floating gate/trapping layer 60 charge), in contrast to the electron tunneling process described above with regard to FIGS. 7A-7B. In the embodiment illustrated in FIGS. 9A-9B, the floating body 24 is set to a neutral or negative charge prior to the performing the restore operation/process, i.e., a "0" state is written to floating body 24. In the embodiment of FIGS. 9A-9B, to perform the restore operation, terminal 72 is set to a substantially neutral voltage, a positive voltage is applied to terminal 74, a negative voltage is applied to terminal 70 and a positive voltage that is less positive than the positive voltage applied to terminal 74 is applied to terminal 76. If the floating gate/trapping layer 60 is negatively charged, as illustrated in FIG. 9A, this negative charge enhances the driving force for the band-to-band hot hole injection process, whereby holes are injected from the n-region 18 into floating body 24, thereby restoring the "1" state that the volatile memory cell 50 had held prior to the performance of the shadowing operation. If the floating gate/trapping layer 60 is not negatively charged, such as when the floating gate/trapping layer 60 is positively charged as shown in FIG. 9B or is neutral, the hot band-to-band hole injection process will not occur, as illustrated in FIG. 9B, resulting in memory cell 50 having a "0" state, just as it did prior to performance of the shadowing process. Accordingly, if floating gate/trapping layer 60 has a positive charge after shadowing is performed, the volatile memory of floating body 24 will be restored to have a negative charge ("0" state), but if the floating gate/trapping layer 60 has a negative or neutral charge, the volatile memory of floating body 24 will be restored to have a positive charge ("1" state).

In one particular non-limiting example of this embodiment, about 0 volts is applied to terminal 72, about +2 volts is applied to terminal 74, about −1.2 volts is applied to terminal 70, and about +0.6 volts is applied to terminal 76. However, these voltage levels may vary, while maintaining the relative relationships between the charges applied, as described above. For example, voltage applied to terminal 72 may be in the range of about +1.5 volts to about +3.0 volts, voltage applied to terminal 74 may be in the range of about 0.0 volts to about +0.6 volts, voltage applied to terminal 70 may be in the range of about 0.0 volts to about −3.0 volts, and voltage applied to terminal 76 may be in the range of about 0.0 volts to about +1.0 volts.

Note that this process occurs non-algorithmically, as the state of the floating gate/trapping layer 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention. From these operations, it has been shown that cell 50 provides a memory cell having the advantages of a DRAM cell, but where non-volatility is also achieved.

Figure 10:
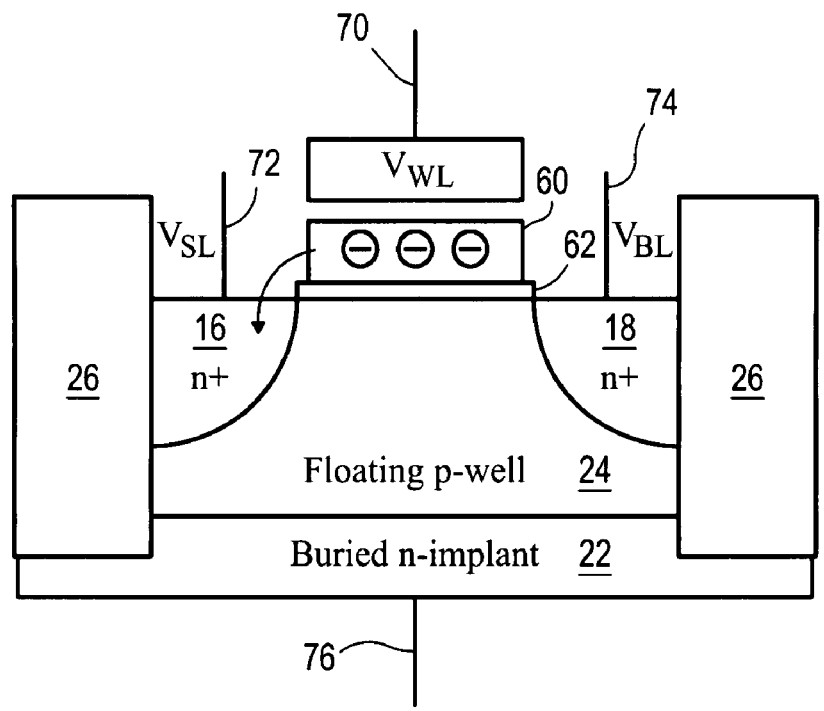
FIG. 10 illustrates resetting the floating gate(s)/trapping layer(s) to a predetermined state.

After restoring the memory cell(s) 50, the floating gate(s)/trapping layer(s) 60 is/are reset to a predetermined state, e.g., a positive state as illustrated in FIG. 10, so that each floating gate/trapping layer 60 has a known state prior to performing another shadowing operation. The reset process operates by the mechanism of electron tunneling from the floating gate/trapping layer 60 to the source region 18, as illustrated in FIG. 10.

To perform a reset operation according to the embodiment of FIG. 10, a highly negative voltage is applied to terminal 70, a substantially neutral voltage is applied to SL terminal 72, BL terminal 74 is allowed to float or is grounded, and a positive voltage is applied to terminal 76. By applying a neutral voltage to terminal 72 and maintaining the voltage of region 16 to be substantially neutral, this causes region 16 to function as a sink for the electrons from floating gate/trapping layer 60 to travel to by electron tunneling. A large negative voltages is applied to WL terminal 70 and a low positive voltage is applied to BW terminal 76. If the floating gate/trapping layer 60 is negatively charged, electrons will tunnel from floating gate/trapping layer 60 to region 16, and floating gate/trapping layer 60 will therefore become positively charged. As a result of the reset operation, all of the floating gate/trapping layer will become positively charged. In one particular non-limiting embodiment, about −18.0 volts is applied to terminal 70, and about +0.6 volts is applied to terminal 76. However, these voltage levels may vary, while maintaining the relative relationships between the charges applied, as described above. For example, voltage applied to terminal 70 may be in the range of about −12.0 volts to about −20.0 volts, and the voltage applied to terminal 76 may be in the range of about 0.0 volts to about 1.0 volts.

Having described the various operations of cell 50 above, reference is again made to FIG. 1 to describe operation of a memory device having a plurality of memory cells 50. The number of memory cells can vary widely, for example ranging from less than 100 Mb to several Gb, or more. It is noted that, except for the DRAM operations of writing and reading (event 104), which by necessity must be capable of individual, controlled operations, the remaining operations shown in FIG. 1 can all be carried out as parallel, non-algorithmic operations, which results in a very fast operating memory device.

At event 102, the memory device is initialized by first setting all of the floating gates/trapping layers to a positive state, in a manner as described above with reference to FIG. 10, for example. For example, a control line can be used to input a highly negative voltage to each of terminals 70, in parallel, with voltage settings at the other terminals as described above with reference to FIG. 10. Individual bits (or multiple bits, as described below) of data can be read from or written to floating bodies 24 of the respective cells at event 104.

The shadowing operation at event 106 is conducted in a mass parallel, non-algorithmic process, in any of the same manners described above, with each of the cells 50 performing the shadowing operation simultaneously, in a parallel operation. Because no algorithmic interpretation or measurement is required to transfer the data from non-volatile to volatile memory (24 to 60), the shadowing operation is very fast and efficient.

To restore the data into the volatile portion of the memory cells 50 of the memory device (i.e., restore charges in floating bodies 24), a state "0" is first written into each of the floating bodies 24, by a parallel process, and then each of the floating bodies is restored in any of the same manners described above with regard to a restoration process of a single floating body 24. This process is also a mass, parallel non-algorithmic process, so that no algorithmic processing or measurement of the states of the floating gates/trapping layers 60 is required prior to transferring the data stored by the floating gates/trapping layers 60 to the floating bodies 24. Thus, the floating bodies are restored simultaneously, in parallel, in a very fast and efficient process.

Upon restoring the volatile memory at event 108, the floating gates/trapping layers 60 are then reset at event 110, to establish a positive charge in each of the floating gates/trapping layers, in the same manner as described above with regard to initializing at event 110.

Figure 11A:
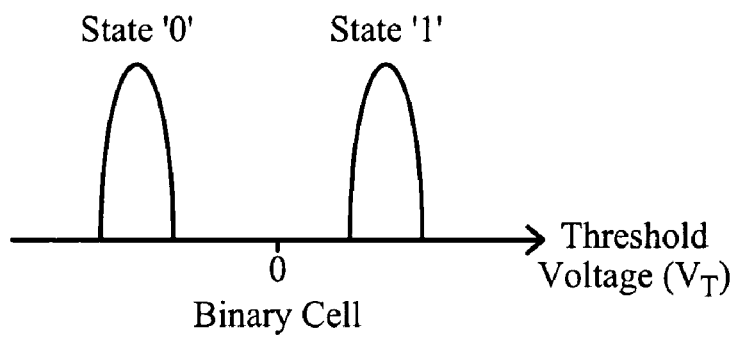
FIGS. 11A illustrates the states of a binary cell, relative to threshold voltage.
Figure 11B:
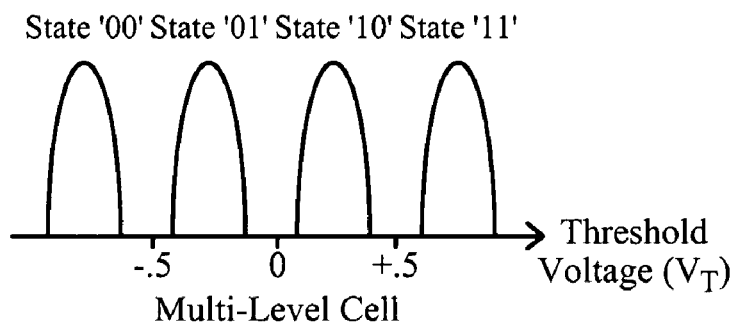
FIG. 11B illustrates the states of a multi-level cell, relative to threshold voltage.

Up until this point, the description of cells 50 have been in regard to binary cells, in which the data memories, both volatile and non-volatile, are binary, meaning that they either store state "1" or state "0". FIG. 11A illustrates the states of a binary cell, relative to threshold voltage, wherein a voltage less than or equal to a predetermined voltage (in one example, the predetermined voltage is 0 volts, but the predetermined voltage may be a higher or lower voltage) in floating body 24 is interpreted as state "0", and a voltage greater than the predetermined voltage in floating body 24 is interpreted as state "1". However, in an alternative embodiment, the memory cells described herein can be configured to function as multi-level cells, so that more than one bit of data can be stored in each cell 50. FIG. 11B illustrates an example of voltage states of a multi-level cell wherein two bits of data can be stored in each cell 50. In this case, a voltage less than or equal to a first predetermined voltage (e.g., 0 volts or some other predetermined voltage) and greater than a second predetermined voltage that is less than the first predetermined voltage (e.g., about −0.5 volts or some other voltage less than the first predetermined voltage) in floating body 24 volts is interpreted as state "01", a voltage less than or equal to the second predetermined voltage is interpreted as state "00", a voltage greater than the first predetermined voltage and less than or equal to a third predetermined voltage that is greater than the first predetermined voltage (e.g., about +0.5 volts or some other predetermined voltage that is greater than the first predetermined voltage) is interpreted to be state "10" and a voltage greater than the third predetermined voltage is interpreted as state "11".

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A semiconductor memory cell comprising:
a substrate having a first conductivity type;
a first region embedded in the substrate at a first location of the substrate and having a second conductivity type;
a second region embedded in the substrate at a second location the substrate and have the second conductivity type, such that at least a portion of the substrate having the first conductivity type is located between the first and second locations and functions as a floating body to store data in volatile memory;
a floating gate or trapping layer positioned in between the first and second locations and above a surface of the substrate and insulated from the surface by an insulating layer; the floating gate or trapping layer being configured to receive transfer of data stored by the volatile memory and store the data as nonvolatile memory in the floating gate or trapping layer upon interruption of power to the memory cell; and
a control gate positioned above the floating gate or trapping layer and a second insulating layer between the floating gate or trapping layer and the control gate.

2. The semiconductor memory cell of claim 1, wherein the surface comprises a top surface, the cell further comprising a buried layer at a bottom portion of the substrate, the buried layer having the second conductivity type.

3. The semiconductor memory cell of claim 1, wherein the first conductivity type is "p" type and the second conductivity type is "n" type.

4. The semiconductor memory cell of claim 1, further comprising insulating layers bounding the side surfaces of the substrate.

5. The semiconductor cell of claim 1, wherein the floating body is configured so that data can be written thereto by hot hole injection.

6. The semiconductor memory cell of claim 1, wherein when power to the cell is interrupted, data transfer from the floating body to the floating gate or trapping layer occurs and the floating gate or trapping layer stores the data as non-volatile memory.

7. The semiconductor memory cell of claim 1, wherein the floating gate or trapping layer stores a charge in non-volatile memory that is complementary to a charge that was stored in the floating body at a time when the power is interrupted.

8. The semiconductor memory cell of claim 6, wherein when power is restored to the cell, data transfer from the floating gate or trapping layer to the floating body occurs and the cell functions as volatile memory.

9. The semiconductor memory cell of claim 8, wherein a state of the floating gate or trapping layer is set to a positive state after the data is transferred from the floating gate or trapping layer to the floating body.

10. The semiconductor memory cell of claim 1, wherein the semiconductor memory cell functions as a binary cell.

11. The semiconductor memory cell of claim 1, wherein the semiconductor memory cell functions as a multi-level cell.

12. A method of operating a memory cell having a floating body for storing, reading and writing data as volatile memory, and a floating gate or trapping layer for storing data as non-volatile memory, the method comprising:
reading and storing data to the floating body while power is applied to the memory cell;
transferring the data stored in the floating body to the floating gate or trapping layer when power to the cell is interrupted; and
storing the data in the floating gate or trapping layer as non-volatile memory.

13. The method of claim 12, wherein the data stored in the floating body is stored as volatile memory.

14. The method of claim 12, further comprising:
transferring the data stored in the floating gate or trapping layer to the floating body when power is restored to the cell;
and storing the data in the floating body as volatile memory.

15. The method of claim 12, wherein the data transferred is stored in the floating gate or trapping layer with a charge that is complementary to a charge of the floating body when storing the data.

16. The method of claim 12, wherein the transferring is a non-algorithmic process.

17. The method of claim 16, wherein the transferring is a parallel, non-algorithmic process.

18. The method of claim 14, wherein the transferring is a non-algorithmic process.

19. The method of claim 14, further comprising restoring the floating gate or trapping layer to a predetermined charge state.

20. The method of claim 14, further comprising writing a predetermined state to the floating body prior to the transferring the data stored in the floating gate or trapping layer to the floating body.

21. The method of claim 20, wherein the predetermined state is state "0".

22. A method of operating a semiconductor storage device comprising a plurality of memory cells each having a floating body for storing, reading and writing data as volatile memory, and a floating gate or trapping layer for storing data as non-volatile memory, the method comprising:
reading and storing data to the floating bodies as volatile memory while power is applied to the device;
transferring the data stored in the floating bodies, by a parallel, non-algorithmic process, to the floating gates or trapping layers corresponding to the floating bodies, when power to the device is interrupted; and
storing the data in the floating gates or trapping layers as non-volatile memory.

23. The method of claim 22, further comprising:
transferring the data stored in the floating gates or trapping layers, by a parallel, non-algorithmic restore process, to the floating bodies corresponding to the floating gates or trapping layers, when power is restored to the cell;
and storing the data in the floating bodies as volatile memory.

24. The method of claim 22, further comprising initializing the floating gates or trapping layers, to each have the same predetermined state prior to the transferring.

25. The method of claim 24, wherein the predetermined state comprises a positive charge.

26. The method of claim 22, wherein the data transferred is stored in the floating gates or trapping layers with charges that are complementary to charges of the floating bodies when storing the data.

27. The method of claim 23, further comprising restoring the floating gates or trapping layers to a predetermined charge state after the restore process.

28. The method of claim 23, further comprising writing a predetermined state to the floating bodies prior to the transferring the data stored in the floating gates or trapping layers to the floating bodies.

29. The method of claim 28, wherein the predetermined state is state "0".

30. A semiconductor storage device comprising a plurality of memory cells each having a floating body for storing, reading and writing data as volatile memory, and a floating gate or trapping layer for storing data as non-volatile memory, the device operating as volatile memory when power is applied to the device, and the device storing data from the volatile memory as non-volatile memory when power to the device is interrupted.

31. The device of claim 30, wherein data is transferred from the volatile memory to the non-volatile memory by a parallel, non-algorithmic mechanism.

32. The device of claim 30, wherein the device is configured to transfer data stored in non-volatile memory to store the data in the volatile memory when power is restored to the device.

33. The device of claim 32, wherein the data is transferred from the non-volatile memory to the volatile memory by a parallel, non-algorithmic mechanism.

* * * * *

UNITED STATES PATENT AND TRADEMARK OFFICE
CERTIFICATE OF CORRECTION

PATENT NO.          : 7,760,548 B2                                              Page 1 of 1
APPLICATION NO.     : 11/998311
DATED               : July 20, 2010
INVENTOR(S)         : Widjaja It is certified that error appears in the above-identified patent and that said Letters Patent is hereby corrected as shown below:

Specification

Column 5, line 18, please delete "nonvolatile" and insert --non-volatile--;
Column 5, line 48, please delete "nonvolatile" and insert --non-volatile--;
Column 5, line 52, please delete "nonvolatile" and insert --non-volatile--;
Column 5, line 53, please delete "nonvolatile" and insert --non-volatile--;
Column 5, line 62, please delete "nonvolatile" and insert --non-volatile--;
Column 7, line 12, please delete "nonvolatile" and insert --non-volatile--;
Column 10, line 3, please delete "measure" and insert --measured--;

Claims

Column 14, line 20, claim 1, please delete "location" and insert --location of--; and
Column 14, line 30, claim 1, delete "nonvolatile" and insert --non-volatile--.

Signed and Sealed this
Fifteenth Day of March, 2016

Michelle K. Lee
*Director of the United States Patent and Trademark Office*